(12) United States Patent
Sonobe

(10) Patent No.: US 6,871,308 B1
(45) Date of Patent: Mar. 22, 2005

(54) SEMICONDUCTOR INSPECTION METHOD

(75) Inventor: Hiroshi Sonobe, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/557,088

(22) Filed: Apr. 21, 2000

(30) Foreign Application Priority Data

Apr. 21, 1999 (JP) .......................................... 11-113266

(51) Int. Cl.$^7$ ....................... G01R 31/28; G01R 31/26; G06F 17/50
(52) U.S. Cl. ......................... 714/724; 324/765; 703/13
(58) Field of Search ............................. 714/25, 27, 32, 714/33, 724, 727, 735, 736, 738, 741, 819, 824; 703/13, 15, 16; 716/4; 706/5, 33, 112, 1, 2; 324/765

(56) References Cited

U.S. PATENT DOCUMENTS

| 5,485,094 A | * 1/1996 | Endoh et al. ............... 324/537 |
| 5,513,188 A | 4/1996 | Parker et al. |
| 5,636,229 A | 6/1997 | Eerenstein et al. |
| 6,202,181 B1 | * 3/2001 | Ferguson et al. ........... 714/724 |
| 6,370,594 B1 | * 4/2002 | Chang et al. .................. 710/3 |

* cited by examiner

Primary Examiner—Albert Decady
Assistant Examiner—Cynthia Britt
(74) Attorney, Agent, or Firm—Parkhurst & Wendel, L.L.P.

(57) ABSTRACT

The present invention provides a semiconductor inspection method which detects a short circuit failure of adjacent lines having the possibility of a short circuit occurring, which short circuit failure cannot be detected by the conventional semiconductor inspection methods. The semiconductor inspection method comprises steps of: extracting adjacent lines having the possibility of a short circuit occurring between the lines from a layout patter of a semiconductor (step S101), obtaining input logical values such that one of the adjacent lines has a logical value "1" while the other has a logical value "0" (step S102), and monitoring outputs of a logical circuit which receives the input logical values, thereby to compare the outputs with output logical values which are expected when the input logical values are input to the logical circuit (step S103). Therefore, the short circuit failure of the adjacent lines in the logical circuit can be correctly detected in a short time.

4 Claims, 5 Drawing Sheets

Fig.5 (a)

| logical column \ terminal | A | B | C | D | E | F |
|---|---|---|---|---|---|---|
| l | 1 | 1 | 1 | 0 | 1 | 0 |
| m | 0 | 1 | 1 | 1 | 0 | 1 |

Fig.5 (b)

| logical column \ terminal | A | B | C | E |
|---|---|---|---|---|
| n | 1 | 1 | 0 | 0 |
| o | 0 | 1 | 1 | 0 |

Fig.5 (c)

| logical column \ terminal | A | B | C | D | E | F |
|---|---|---|---|---|---|---|
| p | 1 | 0 | 1 | 1 | 0 | 1 |
| q | 1 | 1 | 0 | 1 | 0 | 0 |

Fig.5 (d)

| logical column \ terminal | A | B | C | D | E | F |
|---|---|---|---|---|---|---|
| r | 1 | 1 | 1 | 0 | 1 | 0 |
| s | 0 | 1 | 1 | 1 | 0 | 1 |
| t | 1 | 0 | 1 | 1 | 0 | 1 |
| u | 1 | 1 | 0 | 1 | 0 | 0 |

Prior Art

Fig.6 (a)

| logical column \ terminal | A | B | C | E |
|---|---|---|---|---|
| a | 1 | 1 | 1 | 1 |
| b | 0 | 1 | 1 | 0 |
| c | 1 | 0 | 1 | 0 |
| d | 1 | 1 | 0 | 0 |

Fig.6 (b)

| logical column \ terminal | C | D | F |
|---|---|---|---|
| e | 1 | 1 | 1 |
| f | 0 | 1 | 0 |
| g | 1 | 0 | 0 |

Fig.6 (c)

| logical column \ terminal | A | B | C | D | E | F |
|---|---|---|---|---|---|---|
| h | 1 | 1 | 1 | 1 | 1 | 1 |
| i | 0 | 1 | 1 | 0 | 0 | 0 |
| j | 1 | 0 | 1 | 0 | 0 | 0 |
| k | 1 | 1 | 0 | 1 | 0 | 0 |

SEMICONDUCTOR INSPECTION METHOD

FIELD OF THE INVENTION

The present invention relates to a method for inspecting semiconductors of ICs or LSIs, which are constituted by logical circuits.

BACKGROUND OF THE INVENTION

In recent years, it is getting more difficult to detect failures in LSIs because the scales and complexities of LSIs are increased. As an example of methods for detecting the failures, there is a semiconductor inspection method which detects stuck-at failures from circuit data of a logical circuit.

Hereinafter, a description is given of a prior art semiconductor inspection method for detecting stuck-at failures in a logical circuit which comprises a three-input AND gate and a two-input AND gate.

FIG. 2 is a diagram illustrating the logical circuit comprising the three-input AND gate and two-input AND gate. FIG. 3 is a diagram illustrating a layout pattern of the logical circuit shown in FIG. 2. FIGS. 6(a)–6(c) are truth tables showing input logical values and output logical values corresponding thereto, which are used in the prior art semiconductor inspection method.

The logical circuit 200 shown in FIG. 2 includes a three-input AND gate 210 and a two-input AND gate 211. Input to the three-input AND gate 210 is performed through input terminals 201, 202 and 203. Input to the two-input AND gate 211 is performed through input terminals 203 and 204. Outputs from the three-input AND gate 210 and two-input AND gate 211 are performed through output terminals 206 and 207, respectively.

Next, the prior art semiconductor inspection method is described in detail.

Initially, in the three-input AND gate 210, when "1"s are input to the input terminals 201–203 as inputs A–C, respectively, as shown in logical column (a) of the truth table in FIG. 6(a), and an output E of the output terminal 206 is monitored, "0" stuck-at failures in the terminals 201–203 and 206 are detected. In addition, when "0" is input to the input terminal 201 as the input A and "1"s are input to the input terminals 202 and 203 as the inputs B and C, respectively, as shown in logical column (b) of the truth table, and the output E of the output terminal 206 is monitored, "1" stuck-at failures in the terminals 201 and 206 are detected. Similarly, when "0" is input to the input terminal 202 as the input B and "1"s are input to the input terminals 201 and 203 as the inputs A and C, respectively, as shown in logical column (c) of the truth table, and the output E of the output terminal 206 is monitored, or when "0" is input to the input terminal 203 as the input C and "1"s are input to the input terminals 201 and 202 as the inputs A and B, respectively, as shown in logical column (d) of the truth table, and the output E of the output terminal 206 is monitored, "1" stuck-at failures in the input terminals 202 and 203 are detected. Thus, when the combinations of the input logical values shown in the truth table of FIG. 6(a) are input to the terminals, the stuck-at failures in the terminals 201–203 and 206 are detected. Further, the combinations of the input logical values shown in the truth table in FIG. 6(a) have good detection efficiency and failures can be detected with fewer combinations. Accordingly, these combinations are conventionally generally used.

Similarly, also in the two-input AND gate 211, when input logical values as shown in logical column (e) of the truth table in FIG. 6(b) are input to the input terminals 203 and 204 and an output F of the output terminal 207 is monitored, the "0" stuck-at failures in the terminals 203, 204 and 207 are detected. In addition, when input logical values as shown in logical columns (f) and (g) of the truth table in FIG. 6(b) are input to the input terminals 203 and 204 and the respective outputs F of the output terminal 207 are monitored, the "1" stuck-at failures in the terminals 203, 204 and 207 are detected. Therefore, in the logical circuit 200 shown in FIG. 2, when input logical values as shown in logical columns (h)–(k) of the truth table in FIG. 6(c), which is obtained by combining the logical columns (a)–(d) of the truth table in FIG. 6(a) as necessary combinations for detecting the stuck-at failures in the three-input AND gate 210 and the logical columns (e)–(g) of the truth table in FIG. 6(b) as necessary combinations for detecting the stuck-at failures in the two-input AND gate 211, are input to the input terminals 201–204 as the inputs A–D, and the outputs E and F of the output terminals 206 and 207 are monitored, the "0" stuck-at failure and "1" stuck-at failure in the terminals 201–204, 206 and 207 are detected.

Here, in a case where the logical circuit 200 shown in FIG. 2 has a layout pattern as shown in FIG. 3 on a semiconductor, when the input logical values shown in logical columns (h)–(k) of the truth table in FIG. 6(c) given by the prior art semiconductor inspection method for detecting the stuck-at failure are input to the input terminals 201–204, the "0" stuck-at failure and "1" stuck-at failure in the terminals 201–204, 206 and 207 can be detected. However, in this case, since the logical values output from the output terminals 206 and 207 are the same, even when the output terminals 206 and 207 are short-circuited, the short circuit of the terminals cannot be detected. As described above, in the prior art semiconductor inspection method, there are some cases where short circuit failures cannot be detected and failures in LSIs or the like cannot be detected.

SUMMARY OF THE INVENTION

It is an object of the present invention to provide a semiconductor inspection method for detecting short circuit failures occurring between adjacent lines.

Other objects and advantages of the present invention will become apparent from the detailed description and specific embodiments described are provided only for illustration since various additions and modifications within the spirit and scope of the invention will be apparent to those of skill in the art from the detailed description.

A semiconductor inspection method according to a 1st aspect of the present invention comprises steps of: extracting adjacent lines which have a possibility of a short circuit occurring between the lines from a layout pattern of a semiconductor; obtaining input logical values such that one of the adjacent lines has a logical value "1" while the other has a logical value "0"; and monitoring an output of a logical circuit which receives the input logical values, and comparing the monitored output with an output logical value which is expected when the input logical values are input to the logical circuit. Therefore, the short circuit failure between the adjacent lines, which cannot be detected by the prior art semiconductor inspection method, can be detected correctly. Further, the minimum combination of the input logical values is utilized, whereby the short circuit failure can be detected in a shorter time.

A semiconductor inspection method according to a 2nd aspect of the present invention comprises steps of: extracting lines, a distance between said lines being equal to or less than a threshold, from layout data of a semiconductor as adjacent lines; obtaining input logical values such that one of the adjacent lines has a logical value "1" while the other has a logical value "0"; and monitoring an output of a logical circuit which receives the input logical values, and comparing the monitored output with an output logical value which is expected when the input logical values are input to the logical circuit. Therefore, the same effects as those described in the 1st aspect can be obtained.

According to a 3rd aspect of the present invention, there is provided a computer-readable recording medium which records a program for making a computer execute steps of: extracting adjacent lines which have a possibility of a short circuit occurring between the lines from a layout pattern of a semiconductor; obtaining input logical values such that one of the adjacent lines has a logical value "1" while the other has a logical value "0"; and monitoring an output of a logical circuit which receives the input logical values, and comparing the monitored output with an output logical value which is expected when the input logical values are input to the logical circuit. Therefore, the same effects as those described in the 1st aspect can be obtained.

According to a 4th aspect of the present invention, there is provided a computer-readable recording medium which records a program for making a computer execute steps of: extracting lines, a distance between said lines being equal to or less than a threshold, from layout data of a semiconductor as adjacent lines; obtaining input logical values such that one of the adjacent lines has a logical value "1" while the other has a logical value "0"; and monitoring an output of a logical circuit which receives the input logical values, and comparing the monitored output with an output logical value which is expected when the input logical values are input to the logical circuit. Therefore, the same effects as those described in the 1st aspect can be obtained.

BRIEF DESCRIPTION OF THE DRAWINGS

FIGS. 5(a)–5(d) are truth tables showing input logical values and output logical values for the semiconductor inspection method according to the first embodiment.

FIGS. 6(a)–6(c) are truth tables showing input logical values and output logical values for a prior art semiconductor inspection method.

DETAILED DESCRIPTION OF THE PREFERRED EMBODIMENTS

[Embodiment 1]

Hereinafter, a semiconductor inspection method according to a first embodiment of the present invention will be described with reference to the drawings.

Figure 1:
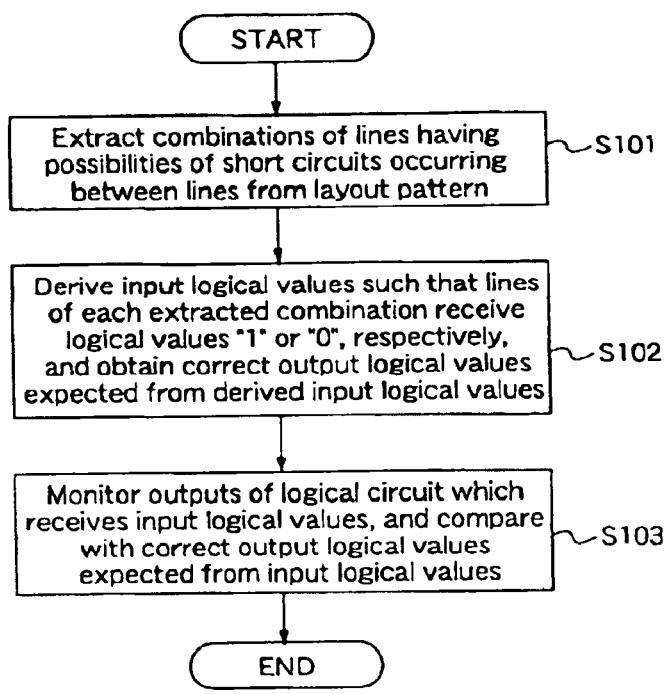
FIG. 1 is a flowchart showing a semiconductor inspection method according to a first embodiment of the present invention.
Figure 2:
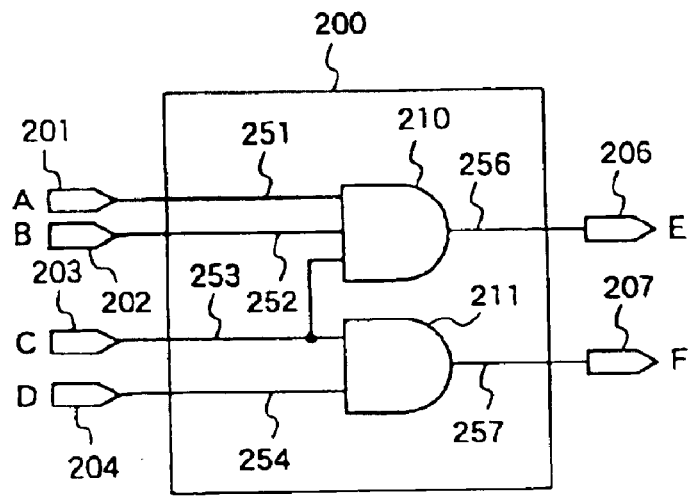
FIG. 2 is a diagram illustrating a logic circuit comprising a three-input AND gate and a two-input AND gate as an example of an inspection target.

FIG. 1 is a flowchart showing the semiconductor inspection method according to the first embodiment. Also in this first embodiment, the description is given with reference to the logical circuit 200 shown in FIGS. 2 and 3, which is referred to in the description of the prior art. Since the logical circuit 200 shown in FIG. 2 is already described as the prior art, this is not described here.

The semiconductor inspection method of the first embodiment is described with reference to FIG. 1.

Initially, in step S101, combinations of lines having possibilities of short circuits occurring between the lines are extracted from the layout pattern of the logical circuit.

Next, in step S102, input logical values are derived such that the lines of each extracted combination receive logical values "1" and "0", respectively, and then correct output logical values which are expected from the derived input logical values are obtained. Here, the correct output logical values which are expected from the input logical values are output logical values obtained when the logical circuit has no failure.

Then, in step S103, outputs of the logical circuit which receives the input logical values which are obtained in step S102 are monitored, and the monitored outputs are compared with the correct output logical values expected from the input logical values. As a result of this comparison, the short circuit failure between the lines is detected.

Figure 4:
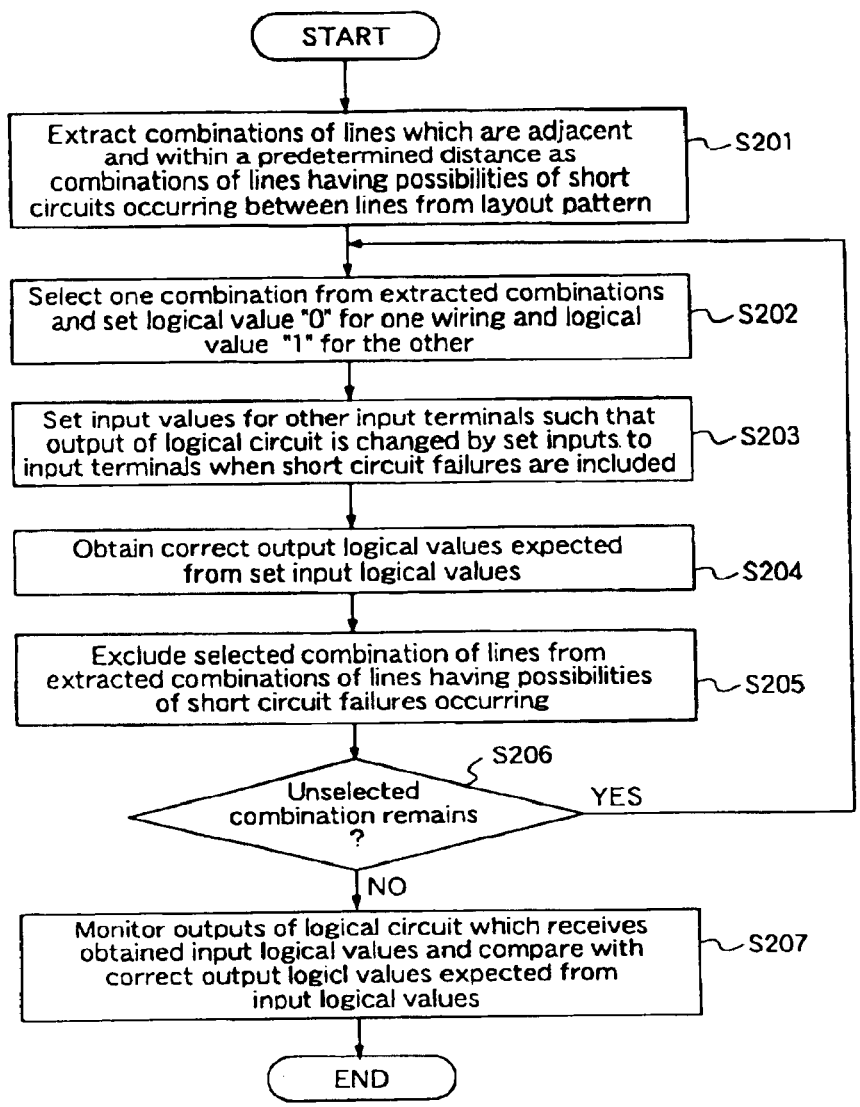
FIG. 4 is a flowchart showing the semiconductor inspection method according to the first embodiment in detail.

FIG. 4 is a flowchart showing the semiconductor inspection method in detail, in accordance with the flowchart of FIG. 1.

Initially, in step S201, combinations of lines which are adjacent to each other and within a predetermined distance are extracted from the layout pattern of the logical circuit as the combinations of lines having possibilities of short circuits occurring between the lines. The process of step S201 corresponds to the process of step S101 in the flowchart of FIG. 1.

In step S202, one combination is selected from the combinations of lines extracted in step S201, and the logical value "0" is set for one of lines of the selected combination and the logical value "1" is set for the other of the lines.

In step S203, input values for other input terminals are set such that when the combination of lines selected in step S202 includes the short circuit failure, the output of the logical circuit is changed by the inputs to the input terminals which are set in step S202, compared with an output in a case including no short circuit failure.

In step 5204, correct output logical values expected from the input logical values which are set in steps S202 and S203 are obtained.

In step S205, the combination of the lines selected in step S202 is excluded from the combinations of lines having the possibilities of short circuit failures occurring, which are extracted in step S201.

In step S206, it is decided whether or not any unselected combinations of lines having the possibilities of the short circuit failures occurring remain. When combinations remain, the processes from step S202 are repeatedly performed. When no combination remains, it proceeds to step S207. These processes of steps S202–S206 correspond to the process of step S102 of flowchart in FIG. 1.

In step S207, the outputs of the logical circuit which receives the input logical values obtained by the processes of steps S202–S206 are monitored, and the monitored outputs are compared with the correct output logical values which are expected from the input logical values. The process of step S207 corresponds to the process of step S103 of the flowchart in FIG. 1.

Next, this semiconductor inspection method of the first embodiment is described using a specific example.

Figure 3:
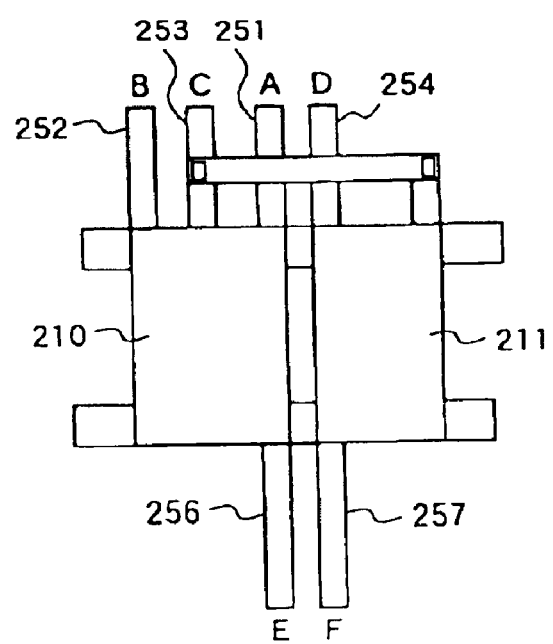
FIG. 3 is a diagram illustrating a layout pattern of the logical circuit.

In this specific example, the logical circuit as shown in FIG. 2 is utilized and this logical circuit has the layout pattern as shown in FIG. 3. FIGS. 5(a)–5(d) are truth tables when the logical values "1" and "0" are input to lines extracted as the lines having the possibility of shorting.

Initially, combination of a line 251 and a line 254, combination of the line 251 and a line 253, combination of a line 252 and the line 253, and combination of a line 256 and a line 257 are extracted from the layout pattern shown in FIG. 3, as the combinations of lines having possibilities of the short circuit failures occurring, because the lines of each combination are adjacent lines and close to each other (step S201).

Then, the combination of the lines 251 and 254 is selected first. One of the logical values "0" and "1" is set for the input terminal 201, and the other of the logical values is set for the input terminal 204 (step S202). In this case, the input terminal 201 is connected to the three-input AND gate 210 of FIG. 2. Since the output E of the three-input AND gate 210 is affected also by the inputs B and C to the input terminals 202 and 203, the respective inputs B and C to the input terminals 202 and 203 are set to the logical values "1" such that the output E of the three-input AND gate 210 is changed by the input A to the input terminal 201 (step s203). When these values are set, the value of the output obtained when there is a short circuit failure between the lines 251 and 254 is different from the value in the case including no short circuit failure.

Then, the correct output logical values which are expected from the set input logical values are obtained (step S204). FIG. 5(*a*) shows the truth table which is obtained in this way. As shown in FIG. 5(*a*), the logical value "0" is set for one of the lines in each of the combination of the lines 251 and 254 and the combination of the lines 256 and 267, and the logical value "1" is set for the other of the lines. Therefore, when the outputs E and F are monitored through the output terminals 206 and 207, the short circuit failures between the lines 251 and 254 and the lines 256 and 257 are detected.

Then, the combination of the lines whose input logical values are obtained to detect the short circuit failures, i.e., the combination of the lines 251 and 254 and the combination of the lines 256 and 257 are excluded from the combinations of lines having the possibilities of the short circuit failures occurring, extracted in step S201 (step S205). When any combinations of lines remain (step S206), the processes of steps S202–S205 are repeatedly performed for the remaining combinations. In this case, the combination of the lines 251 and 253 and the combination of the lines 252 and 253 remain. Therefore, the processes of steps S202–S205 are performed similarly to these combinations of the lines, whereby the truth tables as shown in FIGS. 5(*b*) and 5(*c*) are obtained. When the truth tables in FIGS. 5(*a*)–5(*c*) are integrated with deleting overlapping parts, the truth table as shown in FIG. 5(*d*) is obtained.

Then, the input logical values as shown in logical columns (r)–(u) of the truth table in FIG. 5(*d*) are input to the input terminals 201–204 as the inputs A–D, then the outputs E and F of the output terminals 206 and 207 are monitored, and the monitored outputs E and F are compared with the output logical values of the truth table in FIG. 5(*d*) (step S207). As a result of the comparison, when the outputs E and F of the output terminals 206 and 207 are equal to the output logical values of the truth table in FIG. 5(*d*), it is decided that no short circuit failure occurs. On the other hand, when they are not equal, it is decided that the short circuit failure occurs.

As described above, according to the semiconductor inspection method of this first embodiment, adjacent lines having the possibilities of short circuits occurring between the lines are extracted from the layout pattern. Then, the truth table concerned with the input logical values and output logical values, which enables to detect the short circuit failures of the adjacent lines is obtained. Then, the outputs of the logical circuit which receives the obtained input logical values are monitored and compared with the output logical values, whereby the short circuit failures in the logical circuit can be detected.

In addition, in this embodiment, the truth tables for detecting the short circuit failures between adjacent lines of respective combinations are obtained, and these truth tables are integrated with deleting the overlapping parts. Then, the short circuit failure is detected using this integrated truth table. Therefore, the short circuit failure can be detected in a shorter time.

In this first embodiment, the description is given using a simple logical circuit. However, the short circuit failure in a more complex logical circuit can be easily detected using the semiconductor inspection method of the first embodiment.

Further, in this first embodiment, the case where the adjacent lines having the possibilities of short circuits occurring between the lines are extracted from the layout pattern of the semiconductor is described. However, lines, a distance between the lines being equal to or less than a threshold, can be extracted as adjacent lines from layout data which are data for creating a layout pattern of a semiconductor.

Further, when a recording medium which records a program for implementing the semiconductor inspection method of the first embodiment is supplied to a system or apparatus and a main processor such as a CPU of the system or apparatus reads and executes the program stored in the recording medium, the same effects as those described in the first embodiment can be obtained.

Here, as recording media which record the program, floppy discs, hard discs, optical discs, magnetic discs, magneto-optical discs, CD-ROMs, DVD-RAMs, magnetic tapes, punched cards, nonvolatile memory cards, or ROMs can be utilized.

What is claimed is:

1. A semiconductor inspection method for simultaneously detecting (1) stuck-at failures and (2) short-circuited adjacent lines in a logic circuit of a semiconductor apparatus, the method comprising:

extracting data representing input lines of a logic circuit of a semiconductor apparatus represented by layout data and identifying combinations of adjacent input lines of said input lines;

selecting one combination of adjacent input lines from said extracted combinations and setting each of said selected adjacent input lines to a first logical value of "0" or "1" and setting said input lines other than the selected adjacent input lines to a second logical value of "0" or "1", so that an expected logical output value is output by such logic circuit when a stuck-at failure and a short circuit between the adjacent lines do not exist and an unexpected output logical value is output when at least one of a stuck-at failure and a short circuit between the adjacent lines does exist; and monitoring an output of such logic circuit that receives the input logical values, and comparing the monitored output with an output logical value that is expected when the input logical values are input to such logic circuit.

2. A semiconductor inspection method for simultaneously detecting (1) stuck-at failures and (2) short-circuited adjacent lines in a logic circuit of a semiconductor apparatus, the method comprising:

extracting data representing input lines of a logic circuit of a semiconductor apparatus represented by layout data and identifying combinations of adjacent input lines of said input lines;

selecting one combination of adjacent input lines from said extracted combinations and setting each of said selected adjacent input lines to a first logical value of "0" or "1" and setting said input lines other than the selected adjacent input lines to a second logical value of "0" or "1", so that an expected logical output value is output by such logic circuit when a stuck-at failure and a short circuit between the adjacent lines do not exist and an unexpected output logical value is output when at least one of a stuck-at failure and a short circuit between the adjacent lines does exist; and monitoring an output of a logic circuit that receives the input logical values, and comparing the monitored output with an output logical value that is expected when the input logical values are input to such logic circuit.

3. A computer-readable recording medium comprising a program for causing a computer to execute:

extracting data representing input lines of a logic circuit of a semiconductor apparatus represented by layout data and identifying combinations of adjacent input lines of said input lines;

selecting one combination of adjacent input lines from said extracted combinations and setting each of said selected adjacent input lines to a first logical value of "0" or "1" and setting said input lines other than the selected adjacent input lines to a second logical value of "0" or "1", so that when an expected logical output value is output by such logic circuit when a stuck-at failure and a short circuit between the adjacent lines do not exist and an unexpected output logical value is output when at least one of a stuck-at failure and a short circuit between the adjacent lines does exist; and monitoring an output of a logic circuit that receives the input logical values, and comparing the monitored output with an output logical value that is expected when the input logical values are input to such logic circuit.

4. A computer-readable recording medium comprising a recorded program for causing a computer to execute:

extracting data representing input lines of a logic circuit of a semiconductor apparatus represented by layout data and identifying combinations of adjacent input lines of said input lines;

selecting one combination of adjacent input lines from said extracted combinations and setting each of said selected adjacent input lines to a first logical value of "0" or "1" and setting said input lines other than the selected adjacent input lines to a second logical value of "0" or "1", so that an expected logical output value is output by such logic circuit when a stuck-at failure and a short circuit between the adjacent lines do not exist and an unexpected output logical value is output when at least one of a stuck-at failure and a short circuit between the adjacent lines does exist; and monitoring an output of a logic circuit that receives the input logical values, and comparing the monitored output with an output logical value that is expected when the input logical values are input to such logic circuit.

* * * * *